United States Patent [19]

Bamford

[11] 4,417,777
[45] Nov. 29, 1983

[54] INTEGRATED CIRCUIT CARRIER ASSEMBLY

[75] Inventor: William C. Bamford, Hinsdale, Ill.
[73] Assignee: Molex Incorporated, Lisle, Ill.
[21] Appl. No.: 310,645
[22] Filed: Oct. 13, 1981
[51] Int. Cl.³ ............................................. H01R 13/62
[52] U.S. Cl. .................................. 339/17 CF; 339/65
[58] Field of Search ........................ 339/17 CF, 65, 66

[56] References Cited

U.S. PATENT DOCUMENTS

| | | | |
|---|---|---|---|
| 3,732,529 | 5/1973 | Weisenburger | 339/17 CF |
| 3,784,960 | 1/1974 | Bruckner | 339/17 CF |
| 3,825,876 | 7/1974 | Damor et al. | 339/17 CF |
| 3,953,101 | 4/1976 | Palecek | 339/17 CF |
| 3,989,331 | 11/1976 | Hanlon | 339/17 CF |
| 4,217,024 | 8/1980 | Aldridge et al. | 339/17 CF |
| 4,354,718 | 10/1982 | Bright et al. | 339/17 CF |

Primary Examiner—Joseph H. McGlynn
Attorney, Agent, or Firm—Louis A. Hecht

[57] ABSTRACT

An integrated circuit carrier assembly includes a carrier and a socket nestable on one side of the carrier, the other side of carrier receiving an integrated circuit device. The carrier includes a set of guides one aligned with each lead of the integrated circuit device. Each guide includes a passage which allows a lead to telescope through the carrier into the socket, and a set of tapered surfaces that guide the lead into the passage. The socket includes a terminal that connects each lead of the integrated circuit device to one of a plurality of more durable contact prongs which may then be inserted into the appropriate receptacles of a printed circuit board or the like.

5 Claims, 2 Drawing Figures

INTEGRATED CIRCUIT CARRIER ASSEMBLY

BACKGROUND OF THE INVENTION

1. Field of the Invention

The present invention relates generally to connectors for electrically connecting an integrated circuit device to another circuit element. More particularly, the present invention relates to carriers for integrated circuit devices such that the carrier and device are inserted as a unit into a socket which may in turn be plugged into the appropriate receptacles of a printed circuit or the like.

2. Brief Description of the Prior Art

The modularization and miniaturization of electronic circuit packages has resulted in the development of small, interchangeable electronic devices. These devices, capable of performing couplex functions, can be removably inserted into larger electrical systems, to change the function of these systems.

An integrated circuit device, for example a dual in-line package including an encapsulated electronics package and a pair of spaced parallel rows of flat contact pins, may be mounted in the carrier made of insulative material preparatory to connection to a larger electrical system. The carrier usually has integrally formed means to enable the entire module to be manually grasped for insertion into a socket and later removal from the socket. The socket is in turn removably adapted to be electrically connected to a printed circuit board or the like. If a new function is desired, one need only remove one module from its socket and replace it with another module which is suited to the desired purpose.

Due to several factors including the small size of these integrated circuit devices, the number of contacts or pins associated with each device, the need to ensure good electrical contact between the socket and the device, and the necessary delicacy of the pins or contacts of the integrated circuit device, these pins or contacts are often deformed during attempted insertion of the integrated circuit device into a receptacle. Once the contacts are deformed, even if they are subsequently straightened, reinsertion of the device into the socket or receptacle is difficult.

U.S. Pat. No. 4,209,216 to Brooks discloses a socket insertion guide which guides the pins of the integrated circuit device into the socket. The Brooks structure includes an open ended, generally rectangular housing which conforms to the outside shape of the integrated circuit device and a U-shaped channel which is inserted into the upper open end of the housing after the integrated circuit device has been inserted into the housing. The unit is then plugged into an appropriate socket that fits into the lower open end of the housing. While the use of the Brooks structure would likely be advantageous in preventing pin deformation, the structure does not individually guide the leads of the integrated circuit device and does not positively prevent the bending of the pins inwardly into the device or laterally towards one another upon insertion. Moreover, it is conceivable that during the placement of the channel the pins may be deformed inwardly excessively resulting in greater deformation and more difficult insertion than was likely were the guide not used.

SUMMARY OF THE INVENTION

It is therefore the principal object of the present invention to provide an improved integrated circuit carrier assembly which includes positive means for ensuring against damage to the pins or contacts of the integrated circuit device.

It is also an object of the present invention to provide a carrier that guides the leads of a circuit device individually into the socket.

It is another object of the present invention to provide such a device which facilitates the insertion and withdrawal of integrated circuit devices and thus prevents damage to the circuitry which receives the integrated circuit device.

These and many other objects and advantages of the present invention are achieved by a carrier assembly for an integrated circuit device with a plurality of leads extending from opposite sides thereof. The assembly includes a carrier for mounting the integrated circuit device, including a support surface on which the integrated surface device is supported. A separate socket for receiving the device has a pair of opposite side walls with a plurality of spring terminals mounted on each side wall and extending inwardly of the socket. Each terminal is adapted to electrically engage a lead when the device is received within the socket. A plurality of guide means are included in the carrier, one for each of the leads of the circuit device, for guiding the leads into the socket. Each of the guide means includes a passage extending through the carrier, loosely conformable to a portion of a lead to be inserted into the guide means. Each of the guide means also includes a funnelling means for directing the lead into the passage so that the leads extend completely through the carrier for insertion into the socket. Means are provided to secure the integrated circuit device in the carrier upon insertion of the device into the carrier.

DESCRIPTION OF THE PREFERRED EMBODIMENT

Figure 1:
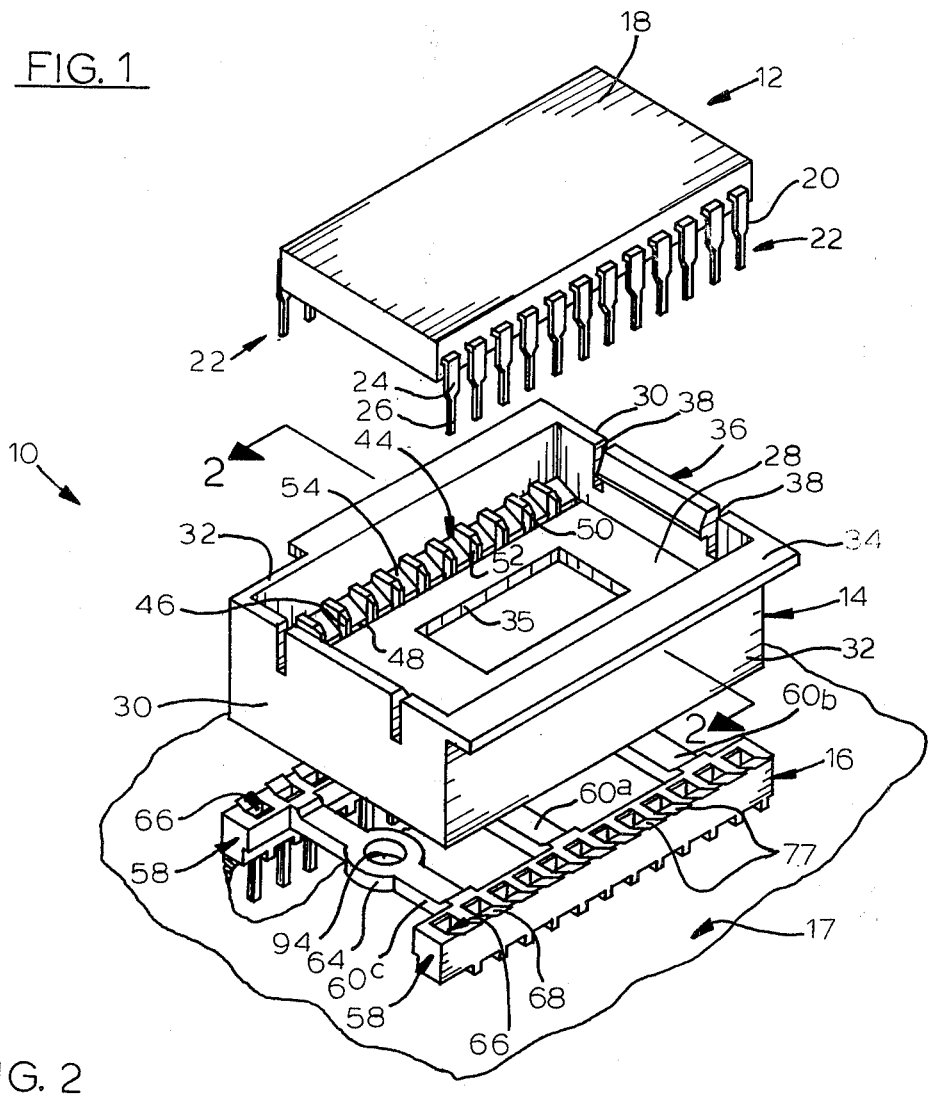
FIG. 1 is a partial, exploded perspective view of one embodiment of the present invention showing an integrated circuit device, the carrier of the present invention, a socket and a printed circuit board.

Referring to the drawing wherein like reference characters are used for like parts throughout the several views, an integrated circuit carrier assembly, generally designated 10, includes an integrated circuit device 12, insertable into and matable with a carrier 14, thereby forming a composite module which is then insertable into and matable with a socket 16. The assembly 10 may be plugged into any desired receptacle 17 such as the printed circuit board illustrated. The integrated circuit device 12 is illustrated as a dual in-line package (DIP) and thus both the carrier 14 and socket 16 are arranged in the same dual in-line configuration. The integrated circuit device 12, in accordance with conventional design, includes a logic package 18 made of electrostatically conductive, insulative material and a plurality of aligned flat pin leads 20 arranged in a pair of spaced apart, parallel rows 22. Each flat pin lead 20 conveniently includes a relatively wider proximal portion 24 and a relatively narrow distal portion 26.

The carrier 14 is made of electrostatically conductive, insulative material, such as plastic or the like, for example nylon 6/6 doped with a conductive material such as carbon fibers, with glass fibers included for added structural integrity. Preferably the filler constitutes about 30% by weight of the composite with the carbon fiber content between 10 and 20% by weight and the glass fiber content from 20 to 10% by weight. The carrier 14 is conveniently formed by conventional plastic molding techniques into a shape that enables it to receive the integrated circuit device 12 in a nested configuration atop its intermediate, horizontal wall 28 and the socket 16 in a nested configuration beneath the wall 28. On the periphery of the wall 28, arranged perpendicularly thereto, a pair of opposed end walls 30 join a pair of opposed side walls 32 perpendicularly related to the walls 30. Each side wall 32 includes a manually graspable flange 34 extending generally horizontally. For purposes of economy, lightness, heat dissipation, and easy removal of the device 12, an opening 35 is located centrally of the horizontal wall 28.

Each end wall 30 includes a conveniently integral, circuit device latch 36, conveniently defined by a pair of spaced apart notches 38 formed in the end walls 30. Each latch 36 includes an inwardly extending catch 40 that tapers outwardly as it extends toward the wall 28. The latches 36 are arranged to secure the integrated circuit device 12 upon the wall 28 of the carrier 14. When the device 12 is inserted so as to initially contact the tapered surface 42 of each catch 40, the latches 36 deflect outwardly allowing the device 12 to be received within the carrier 14. After passage of the device 12 into the carrier 14 has been accomplished, the latches 36 spring back into position securing the device 12 releasably beneath the catches 40.

Figure 2:
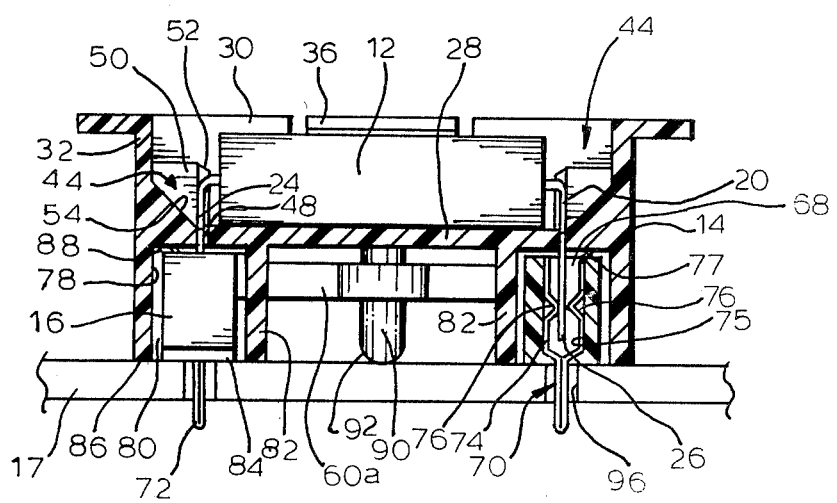
FIG. 2 is a cross-sectional view taken generally along the line 2—2 in FIG. 1 after the integrated circuit device, carrier, and socket have been assembled and inserted into a printed circuit board.

A plurality of guides generally designated as 44 are arranged in a pair of spaced rows in the wall 28, along the walls 32, each guide 44 arranged to align with one of the leads 20 of the circuit device 12. Each guide 44 includes an outer funnelling portion 46 and a passage 48 communicating with the portion 46 and extending completely through the wall 28, as shown in FIG. 2. The outer funnelling portion 46 of each guide 44 shares a pair of spaced apart upstanding tapered ribs 50 with each adjacent guide 44. The ribs 50 extend away from an adjacent wall 32 and between each adjacent pair of passages 48. Each rib 50 includes a tapered surface 52 which converges as it extends away from its wall 32 and inwardly of the carrier 14. In addition, each funnelling portion 46 includes a sloped region 54 located between each pair of adjacent, spaced apart ribs 50. The sloped region 54 slopes downwardly from the inner surface of the adjacent side wall 32 to the passage 48 associated with each portion 46.

The socket 16, completely separable from the carrier 14, includes a pair of spaced apart side portions 58 joined by three spaced apart cross-pieces 60. Crosspiece 60c includes an intermediate aligning journal 64. The socket 16, like the carrier 14, is preferably made of electrostatically conductive, insulative material, conveniently formed by conventional plastic molding techniques. Conveniently, the spacing between the cross-pieces 60a and 60b is different than the spacing between the cross-pieces 60a and 60c.

Each side portion 58 includes a plurality of spring terminals 66, each aligned with an overlying guide 44 which in turn is alignable with a lead 20 of the integrated circuit device 12. As shown in FIG. 2, each terminal 66 includes an opening 68 which initially receives the distal portion 26 of a lead 20.

A contact member 70 is secured within the interior of each terminal 66, the member 70 conveniently being formed by bending a single strip of metal upon itself. This results in a doubled contact prong 72 which extends outwardly beneath the socket 16, and a pair of upstanding contact arms 74, 75 extending upwardly from the prong 72. The contact arms 74, 75 are conveniently deformed to define a pair of inwardly jutting contacts 76 which are held against the lead 20 by the spring action supplied by their arms 74, 75. A distal portion 77 of each contact arm 75 is bent outwardly to guide the insertion of the distal portion 26 of a lead 20 into the upper opening 68.

Since the wall 28 is located intermediately of the end walls 30 and side walls 32, a socket receiving recess 78 is defined beneath the wall 28, as shown in FIG. 2. A socket receiving channel 80 is defined between the end walls 30 and side walls 32 by a plurality of downwardly directed tabs 82, one pair sized to be received between and flush against the cross-pieces 60a and 60b and another pair (not shown) sized to fit between and flush against the cross-pieces 60a and 60c. The recess 78 is preferably sized to entirely recess or nest the socket 16 within the carrier 14 such that the lower surface 84 of the socket 16 is approximately flush with the lower surface 86 of the carrier 14, while leaving a slight gap 88 between the top of the socket 16 and the wall 28 of the carrier 14. A cylindrical downwardly extending polarizing pin 90 is secured to the wall 28 and has a rounded free end 92 extending through the hole 94 in the aligned intermediate aligning journal 64 which conforms closely to the circumference of the pin 90. The length of the pin 90 is such that it becomes journalled within the aligning journal 64 before the leads 20 are inserted into the socket 16.

The assembly 10 is utilized by initially inserting the integrated circuit device 12 into the carrier 14, by hand. This may be accomplished by visually aligning each lead 20 of one row 22 of leads with the appropriate row of guides 44, inserting this row of leads into the aligned guides, and thereafter rotating the device 12 to insert the other row 22 of leads 20 into the remaining row of aligned guides 44. The device 12 is then pressed into the carrier 14 until the latches 36 secure the device 12 therein. The insertion of the leads 20 into the carrier 14 is guided initially by the outer converging portion 46 of each guide 44. The upstanding tapered ribs 50 separate the various individual leads 20 and prevent them from being laterally bent into one another. Thereafter the sloped regions 54 ensure that the individual leads 20 are deflected inwardly to the passages 48. When the device 12 is secured within the carrier 14, the leads 20 are guided and protected by their telescoping insertion through the passages 48.

The combined device 12 and carrier 14 may then be manually positioned atop the socket 16 by grasping the carrier 14 using the flanges 34 and forcing the carrier 14 over the socket 16 such that the socket 16 enters the socket receiving channel 80 in the carrier 14. This process is facilitated by the pins 90 which initially align the carrier 14 with the socket 16 as it enters the aligning journal 64. This assures that the leads 20 are inserted into the upper opening 68 of each spring terminal 66.

The alignment of the carrier 14 and the device 12 with the socket 16 is further facilitated by the engagement of the tabs 82 between the cross-pieces 60. Particularly the carrier 14 is guided onto the socket 16 not only by the pin 90 but also by the tabs 82, conveniently extending outwardly of the carrier 14 to an extent equal to that of the pin 90. Moreover since the spacing between the cross-pieces 60a and 60b is preferably different from that between the cross-pieces 60a and 60c, and a pair of the tabs 82 are sized to fit only between the cross-pieces 60a and 60b and another pair of tabs 82 are sized to fit only between the cross-pieces 60a and 60c, the carrier 14 can be positioned atop the socket 16 in only one preferred alignment. Moreover the irregular spacing between the pins 90 and cross-pieces 60 similarly restrict the orientation of the device 12 with respect to the socket 16. This prevents the insertion of the leads 20 of the device 12 into the socket 16 in an orientation 180° from that intended.

As the carrier 14 continues to move toward the socket 16, the leads 20 enter the terminals 66 and become retained by the spring action of the contact arms 74, 75 which force their contacts 76 against the opposite sides of each lead 20. Thus, the leads 20 telescope straight through the carrier 14 and straight into the terminals 66. The outwardly jutting contact prongs 72, of greater strength than the leads 20, can then be plugged into the appropriate receptacles 17, such as the printed circuit board illustrated having the prong receiving apertures 96, without concern for bending the prongs 72. In this way, each individual lead 20 is both protected and guided during the connection of the device 12 to the receptacle 17 thereby ensuring against undesired crimping of the leads 20 during this process.

We claim:

1. An integrated circuit carrier assembly for an integrated circuit device with a plurality of leads extending from opposite sides thereof including, in combination,
   a carrier for mounting said integrated circuit device, said carrier including a support surface upon which said integrated circuit device is supported,
   a socket for receiving the leads of said device, comprising a pair of parallel spaced apart housing portions and a plurality of terminals mounted in each of said housing portions, each terminal being adapted to electrically engage a lead when said device is received in said carrier, said housing portions being joined by at least two cross-members,
   a plurality of guide means included in said carrier, one for each of the leads of said integrated circuit device, for guiding said leads into said socket through said carrier, each of said guide means including a passage extending through said carrier, each of said guide means further including a funnelling means for directing said lead into said passage, and
   means for securing said device in said carrier upon insertion of said device into said carrier,
   the improvement comprising:
   tabs formed integrally with and extending from the support surface of said carrier defining channels for separately enclosing each of the housing portions of said socket when said carrier is in assembled relationship with said socket.

2. The assembly of claim 1 wherein said device and said socket are nestable totally within said carrier.

3. The assembly of claim 1 including a pin and an aperture, one of which is located on said socket and the other of which is located on said carrier for journalling said pin, the pin being of such length that upon insertion of said carrier onto said socket said pin becomes journalled within said aperture prior to engagement of said leads with said socket.

4. The assembly of claim 1 wherein the leads of said circuit device telescope generally straight through said passages in said carrier and straight into said terminals in said socket, each of said passages loosely conforming to said leads such that said leads are freely journalled within said passages.

5. The assembly of claim 1 including alignment means for insuring that said carrier can be arranged in only one orientation with respect to said socket, said alignment means comprising slots formed in said tabs of said carrier for receiving the cross-members of the socket and said orientation being determined by the position of the slots along said tabs.

* * * * *